(12) United States Patent
Suzawa

(10) Patent No.: US 11,171,042 B2
(45) Date of Patent: Nov. 9, 2021

(54) SEMICONDUCTOR DEVICE AND METHOD OF MANUFACTURING SEMICONDUCTOR DEVICE

(71) Applicant: FUJI ELECTRIC CO., LTD., Kawasaki (JP)

(72) Inventor: Takaaki Suzawa, Nagano (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 35 days.

(21) Appl. No.: 16/660,186

(22) Filed: Oct. 22, 2019

(65) Prior Publication Data
US 2020/0051852 A1     Feb. 13, 2020

Related U.S. Application Data

(63) Continuation of application No. PCT/JP2018/036585, filed on Sep. 28, 2018.

(30) Foreign Application Priority Data

Nov. 13, 2017  (JP) .............................. JP2017-218661

(51) Int. Cl.
*H01L 29/423*     (2006.01)
*H01L 21/768*     (2006.01)
(Continued)

(52) U.S. Cl.
CPC .. *H01L 21/76807* (2013.01); *H01L 21/76805* (2013.01); *H01L 21/76877* (2013.01);
(Continued)

(58) Field of Classification Search
CPC ......... H01L 21/76807; H01L 21/76805; H01L 21/76877; H01L 29/401; H01L 29/41708;
(Continued)

(56) References Cited

U.S. PATENT DOCUMENTS

2004/0041207 A1*  3/2004  Takano ............... H01L 29/7397
                                                        257/330
2008/0017897 A1*  1/2008  Saito .................. H01L 29/41741
                                                        257/288
(Continued)

FOREIGN PATENT DOCUMENTS

JP       S49-33431 B1    9/1974
JP       S60-192329 A    9/1985
(Continued)

*Primary Examiner* — Samuel Park
(74) *Attorney, Agent, or Firm* — Rabin & Berdo, P.C.

(57) ABSTRACT

In a contact hole of an interlayer insulating film, a tungsten film forming a contact plug is embedded via a barrier metal. The interlayer insulating film is formed by sequentially stacked HTO and BPSG films. The BPSG film has an etching rate faster than that of the HTO film with respect to a hydrofluoric acid solution used in wet etching of preprocessing before formation of the barrier metal. After the contact hole is formed in the interlayer insulating film, a width of an upper portion of the contact hole at the BPSG film is increased in a step-like shape, to be wider than a width of a lower portion at the HTO film by the wet etching before the formation of the barrier metal, whereby an aspect ratio of the contact hole is reduced. Thus, size reductions and enhancement of the reliability may be realized.

9 Claims, 11 Drawing Sheets

(51) Int. Cl.
*H01L 29/40* (2006.01)
*H01L 29/417* (2006.01)
*H01L 21/311* (2006.01)
*H01L 29/739* (2006.01)

(52) U.S. Cl.
CPC ...... *H01L 29/401* (2013.01); *H01L 29/41708* (2013.01); *H01L 21/31116* (2013.01); *H01L 21/76843* (2013.01); *H01L 21/76864* (2013.01); *H01L 29/7397* (2013.01); *H01L 2221/1036* (2013.01)

(58) Field of Classification Search
CPC ......... H01L 21/31116; H01L 21/76843; H01L 21/76864; H01L 29/7397; H01L 2221/1036; H01L 29/41766; H01L 29/7813; H01L 29/66348; H01L 29/417; H01L 29/7396; H01L 23/53266; H01L 21/76814; H01L 23/53295; H01L 23/485; H01L 21/76804; H01L 21/31111; H01L 21/28; H01L 29/66325; H01L 29/73; H01L 2924/13055; H01L 29/4236
See application file for complete search history.

(56) References Cited

U.S. PATENT DOCUMENTS

| | | | |
|---|---|---|---|
| 2008/0048256 A1* | 2/2008 | Uno | H01L 29/66727 257/334 |
| 2012/0032261 A1* | 2/2012 | Hsieh | H01L 29/086 257/334 |
| 2014/0001532 A1 | 1/2014 | Sakamoto | |
| 2015/0372090 A1* | 12/2015 | Oosawa | H01L 29/7813 257/331 |

FOREIGN PATENT DOCUMENTS

| | | |
|---|---|---|
| JP | S63-175442 A | 7/1988 |
| JP | H04-63462 A | 2/1992 |
| JP | H04-219932 A | 8/1992 |
| JP | H05-74732 A | 3/1993 |
| JP | H08-213453 A | 8/1996 |
| JP | 2004-266082 A | 9/2004 |
| JP | 2005-302752 A | 10/2005 |
| JP | 2014-011173 A | 1/2014 |
| JP | 2014-158041 A | 8/2014 |

* cited by examiner

SEMICONDUCTOR DEVICE AND METHOD OF MANUFACTURING SEMICONDUCTOR DEVICE

CROSS REFERENCE TO RELATED APPLICATIONS

This is a continuation application of International Application PCT/JP2018/036585 filed on Sep. 28, 2018 which claims priority from a Japanese Patent Application No. 2017-218661 filed on Nov. 13, 2017, the contents of which are incorporated herein by reference.

BACKGROUND OF THE INVENTION

1. Field of the Invention

Embodiments of the invention relate to a semiconductor device and a method of manufacturing a semiconductor device.

2. Description of the Related Art

Conventionally, to enhance characteristics of a semiconductor device, refinement of unit cells (functional unit of an element) is advancing. A method of forming a contact plug by embedding in a contact hole of a micro pattern, a metal having a high embedding property such as tungsten (W) and using the contact plug to form a contact (electrical contact) between a front electrode and a semiconductor substrate is known as a method of forming a micro-unit cell (for example, refer to Japanese Laid-Open Patent Publication No. 2005-302752 (paragraphs 0015 to 0016, FIG. 1-1)).

In Japanese Laid-Open Patent Publication No. 2005-302752, in connecting wiring layers that are stacked sandwiching an interlayer insulating film, a titanium (Ti) film and a titanium nitride (TiN) film are sequentially formed along an inner wall of a contact hole formed in the interlayer insulating film. Thereafter, a tungsten film is embedded on the titanium nitride film in the contact hole by a reduction reaction using tungsten hexafluoride ($WF_6$) and monosilane ($SiH_4$) or hydrogen ($H_2$).

A method of manufacturing a conventional semiconductor device will be described. FIG. 10 is a flowchart of an outline of a method of manufacturing a conventional semiconductor device. First, a predetermined element structure is formed at a front surface side of a semiconductor substrate (semiconductor wafer) (step S101). Next, on a front surface of the semiconductor substrate, a high temperature oxide (HTO) film is formed as a first layer of an interlayer insulating film (step S102).

Next, on the front surface of the semiconductor substrate, a silicon oxide film ($SiO_2$ film) is formed by a borophosphosilicate glass (BPSG) film or the like as a second layer of the interlayer insulating film (step S103). Next, on the interlayer insulating film, a resist mask in which formation regions of a contact hole are opened is formed as an etching mask to be used at a subsequent etching process (step S104).

Next, the interlayer insulating film is selectively removed by dry etching using the resist mask as a mask, thereby forming the contact holes (step S105). Each contact hole has a side wall that is substantially orthogonal to the front surface of the semiconductor substrate, and has a substantially rectangular cross-sectional shape having a uniform width in a depth direction. In a process at step S105, a natural oxide film is formed at a silicon (Si) face (contact formation position between a barrier metal and the semiconductor substrate) exposed in the contact holes.

Next, the resist mask is removed (step S106). Next, as preprocessing of a subsequent sputtering process, the natural oxide film formed during the process at step S105 is removed by a reverse sputtering process or wet etching by an aqueous solution of buffered hydrofluoric acid (BHF) (step S107). During a process at step S107, the cross-sectional shape of the contact holes is maintained in the state after the process at step S105.

Next, as a barrier metal, a titanium film and a titanium nitride film are sequentially formed along the inner walls of the contact holes by sputtering (step S108). Next, titanium atoms in the barrier metal and silicon atoms in the semiconductor substrate are caused to react with each other by annealing (heat treatment) to form a titanium silicide, whereby an ohmic contact is formed between the barrier metal and the semiconductor substrate (step S109).

Next, a tungsten film is grown on the titanium nitride film by a chemical vapor deposition (CVD) method so as to be embedded in the contact holes (step S110). Next, the tungsten film is etched back, leaving the tungsten film only on the titanium nitride film in the contact holes (step S111). Thereafter, remaining parts such as a front electrode, a $p^+$ collector region, a rear electrode are formed, thereby completing the semiconductor device.

As a method of forming a contact hole, a further method has been proposed in which, in an interlayer insulating film in which a silicon oxide film and a PSG film are sequentially stacked, an opening (through hole) is formed using a resist mask as a mask. Then, after an opening width of the upper PSG film is made wider than an opening width of the lower silicon oxide film by wet etching by an aqueous solution of fluorinated hydrogen (BHF) to form the contact hole, the resist mask is removed (for example, refer to Japanese Laid-Open Patent Publication No. H5-74732 (paragraphs 0014 to 0016, FIGS. 4 and 5) and Japanese Laid-Open Patent Publication No. S63-175442 (paragraphs 0014 to 0018, FIG. 1).

SUMMARY OF THE INVENTION

According to an embodiment of the invention, a semiconductor device includes a semiconductor substrate having a first main surface and a second main surface opposite to the first main surface, the semiconductor substrate including a first semiconductor region of a second conductivity type provided in a surface layer at a first main surface side of the semiconductor substrate, a second semiconductor region of the first conductivity type, provided at a second main surface side of the semiconductor substrate, an element structure provided at the first main surface side of the semiconductor substrate and having a pn junction between the first semiconductor region and the second semiconductor region, an interlayer insulating film provided on the first main surface of the semiconductor substrate and covering the element structure, the interlayer insulating film including a first insulating film provided on the first main surface of the semiconductor substrate, and a second insulating film provided on the first insulating film and being made from an insulation material having an etching rate faster than an etching rate of an insulation material of the first insulating film with respect to hydrofluoric acid or dilute hydrofluoric acid, a contact hole selectively opening the interlayer insulating film to expose the first main surface of the semiconductor substrate, the contact hole including a lower portion disposed in the first insulating film and an upper portion disposed in the second insulating film, and having a side wall with a step between the upper portion and the lower portion, a width of the upper portion being greater than a width of the lower portion in a direction parallel to the first main surface of the semiconductor substrate, the upper portion having an aspect ratio in a range of 0.5 to 1.5, the lower portion having an aspect ratio in a range of 0.5 to 1.5, a first metal film provided along an inner surface of the contact hole, the first metal film having high adhesion with the semiconductor substrate and forming an ohmic contact with the semiconductor substrate, a second metal film embedded in the contact hole, on the first metal film, and a first electrode provided on the interlayer insulating film and the second metal film, and electrically connected to the first semiconductor region via the second metal film and the first metal film.

In the embodiment, the upper portion of the contact hole has a trapezoidal shape in a cross-sectional view in which a width of an upper side facing the first electrode is greater than a width of a lower side facing the lower portion of the contact hole.

In the embodiment, the lower portion of the contact hole has a trapezoidal shape in a cross-sectional shape in which a width of an upper side facing the upper portion of the contact hole is greater than a width of a lower side facing the first semiconductor region.

In the embodiment, the lower portion has an upper side facing the upper portion and a lower side facing the first semiconductor region, and a width of the lower side of the lower portion of the contact hole is in a range of 0.3 µm to 1.0 µm.

In the embodiment, the first insulating film is a silicon glass film.

In the embodiment, the first insulating film contains phosphorus, or contains phosphorus, and boron.

In the embodiment, the second insulating film is a high temperature oxide film or a thermal oxide film.

In the embodiment, the first metal film contains titanium as a main constituent.

In the embodiment, the second metal film contains tungsten as a main constituent.

In the embodiment, the semiconductor device further includes a third semiconductor region in contact with the second semiconductor region and being provided in a surface layer at a second main surface side of the semiconductor substrate, and a second electrode electrically connected to the third semiconductor region. The element structure has the first semiconductor region, a fourth semiconductor region of the first conductivity type selectively provided in the first semiconductor region, a gate insulating film provided in contact with the first semiconductor region at a portion between the second semiconductor region and the fourth semiconductor region, and a gate electrode provided in the first semiconductor layer via the gate insulating film.

According to another embodiment of the invention, a method of manufacturing a semiconductor device includes a first process of forming a first semiconductor region of a second conductivity type on a second semiconductor region of a first conductivity type, thereby forming a semiconductor substrate having a first main surface and a second main surface, and forming at a first main surface side of the semiconductor substrate, an element structure having a pn junction between the first semiconductor region and the second semiconductor region, a second process of forming on the first main surface of the semiconductor substrate, an interlayer insulating film covering the element structure, the second process includes, forming a first insulating film as the interlayer insulating film, on the first main surface of the semiconductor substrate, and forming a second insulating film as the interlayer insulating film, on the first insulating film, the second insulating film being formed from an insulation material having an etching rate faster than an etching rate of the first insulating film with respect to the aqueous solution, a third process of forming on the interlayer insulating film, a resist film in which predetermined a predetermined portion is opened, a fourth process of selectively removing the interlayer insulating film to form a first contact hole that selectively exposes the first main surface of the semiconductor substrate, by performing etching using the resist film as a mask, a fifth process of removing the resist film, a sixth process of removing a natural oxide film covering a portion of the first main surface of the semiconductor substrate exposed in the first contact hole, by performing wet etching using an aqueous solution containing hydrofluoric acid or a dilute hydrofluoric acid, the sixth process includes forming a step at a side wall of the first contact hole, thereby forming a second contact hole having a lower portion disposed at the first insulating film and an upper portion disposed at the second insulating film, to increase in a step-like shape a width of the upper portion greater than a width of the lower portion in a direction parallel to the first main surface of the semiconductor substrate, the step being formed between the upper portion and the lower portion, a seventh process of forming along an inner surface of the second contact hole, a first metal film having high adhesion with the semiconductor substrate and forming an ohmic contact with the semiconductor substrate, an eighth process of embedding in the second contact hole, a second metal film on the first metal film, and a ninth process of forming a first electrode on the interlayer insulating film and the second metal film, and electrically connecting the first electrode to the first semiconductor region, via the second metal film and the first metal film.

In the embodiment, in the sixth process, by the wet etching, an aspect ratio of the lower portion is set in a range of 0.5 to 1.5.

In the embodiment, in the fourth process, an aspect ratio of the first contact hole is set in a range of 0.5 to 1.5.

In the embodiment, the fourth process includes forming the first contact hole by anisotropic etching.

In the embodiment, the fourth process includes forming the first contact hole by isotropic etching.

In the embodiment, the lower portion has an upper side facing the upper portion and a lower side facing the first semiconductor region, and the fourth process includes making a width of the lower side of the lower portion in a range of 0.3 µm to 1.0 µm.

In the embodiment, the seventh process includes forming the first metal film by a sputtering method.

In the embodiment, the seventh process includes forming the first metal film by a chemical vapor deposition method.

In the embodiment, the first insulating film is a silicon glass film.

In the embodiment, the first insulating film contains phosphorus, or contains phosphorus and boron.

In the embodiment, the second insulating film is a high temperature oxide film or a thermal oxide film.

In the embodiment, the first metal film contains titanium as a main constituent.

In the embodiment, the second metal film contains tungsten as a main constituent.

Objects, features, and advantages of the present invention are specifically set forth in or will become apparent from the

DETAILED DESCRIPTION OF THE INVENTION

Figure 10:
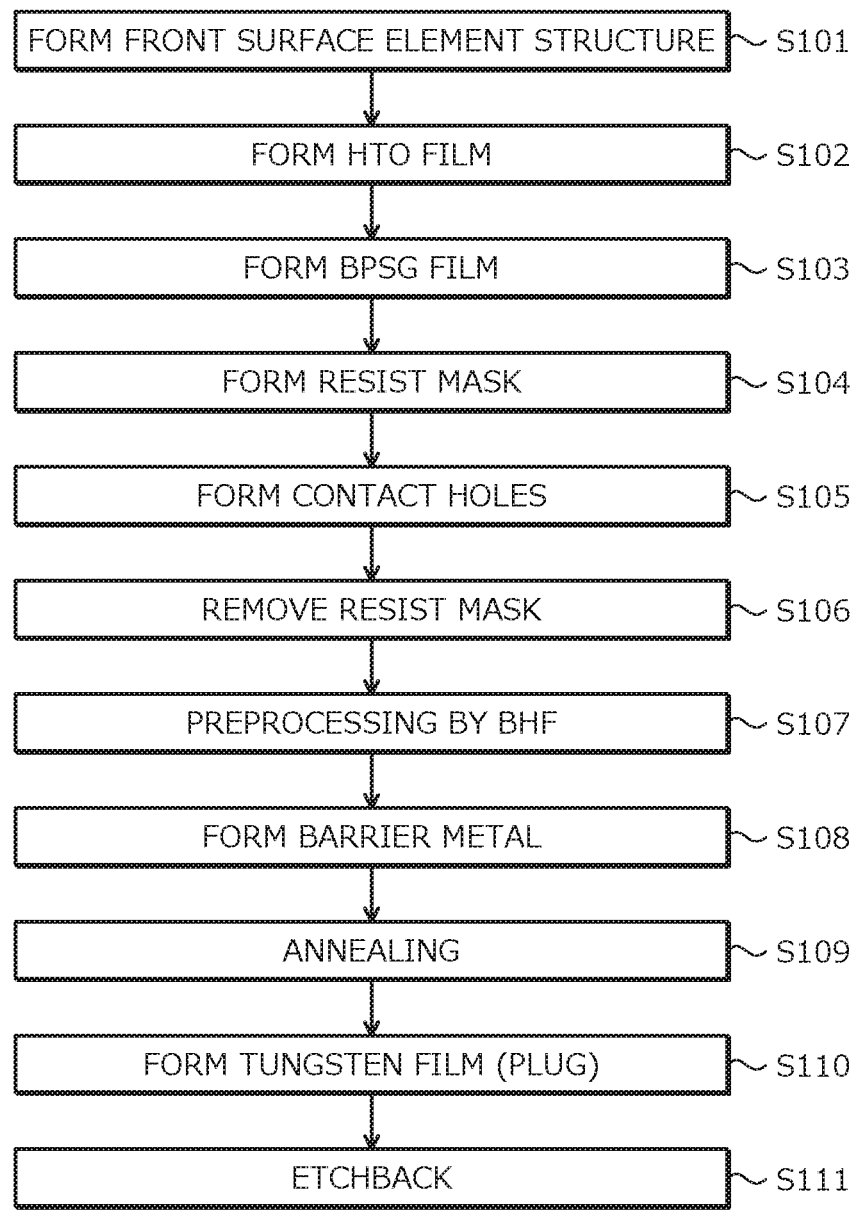
FIG. 10 is a flowchart of an outline of a method of manufacturing a conventional semiconductor device.
Figure 12:
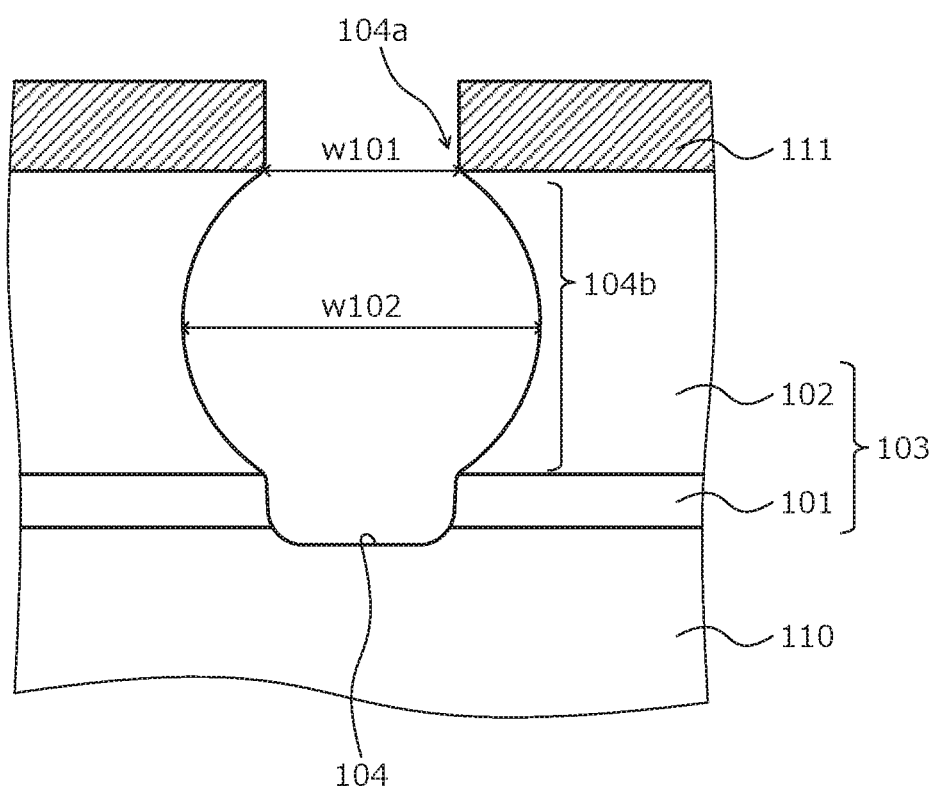
FIG. 12 is a cross-sectional view of the conventional semiconductor device during manufacture.
Figure 13:
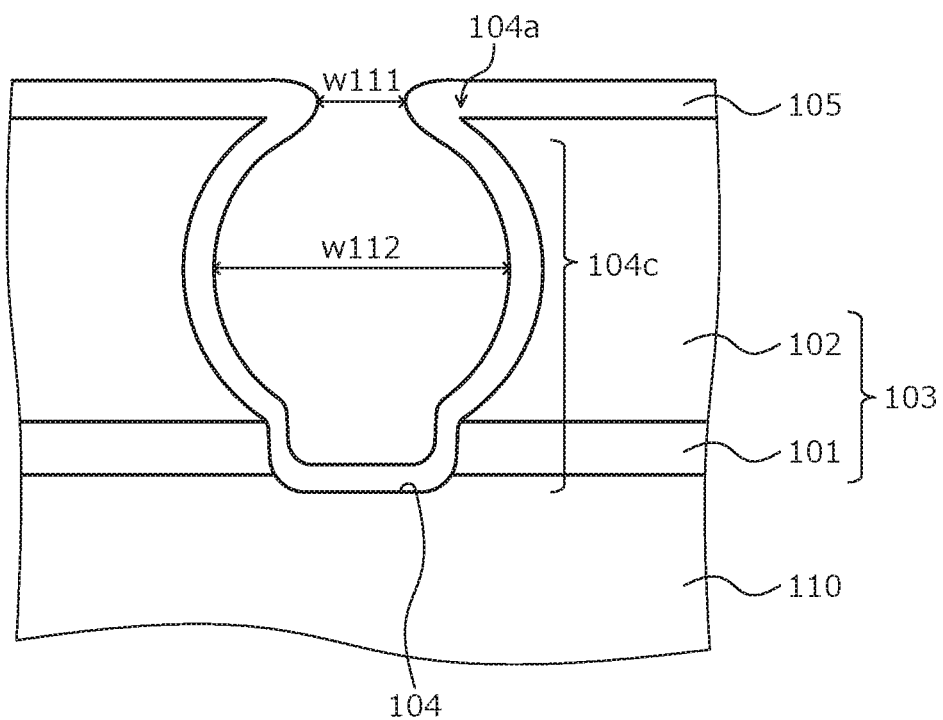
FIG. 13 is a cross-sectional view of the conventional semiconductor device during manufacture.
Figure 14:
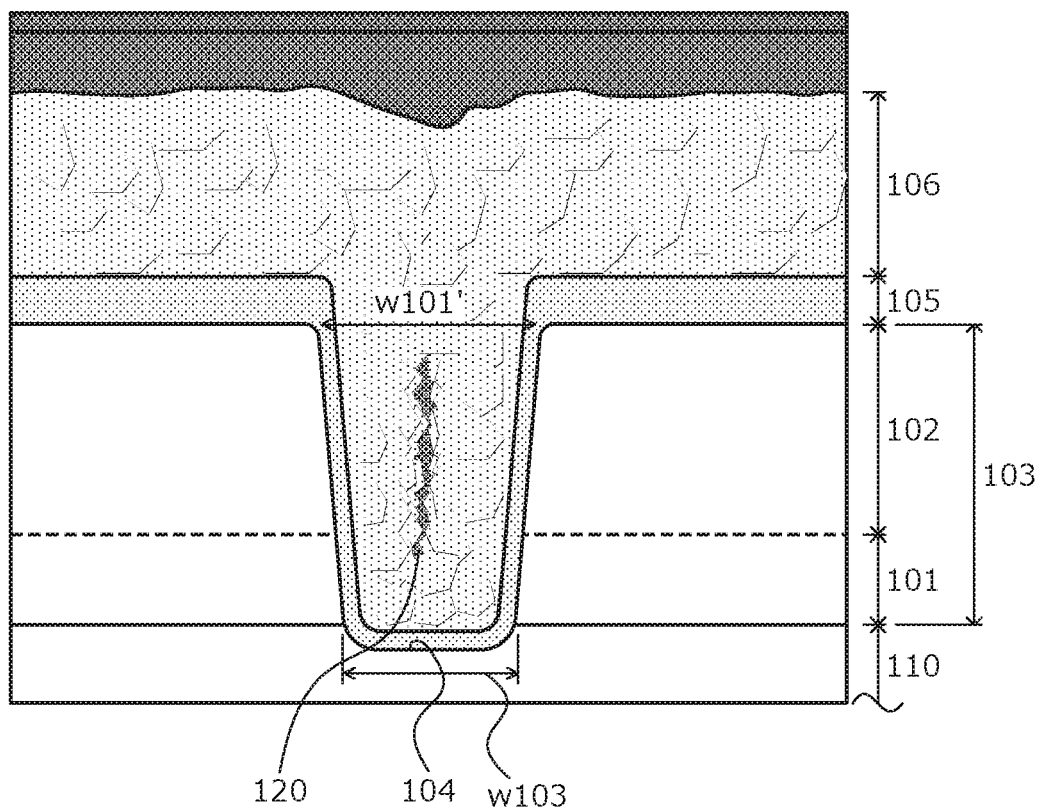
FIG. 14 is a cross-sectional view of the conventional semiconductor device during manufacture.

First, problems associated with the conventional techniques will be discussed. In the conventional techniques (refer to FIG. 10), the following problems occur. FIGS. 11, 12, 13, and 14 are cross-sectional views of a conventional semiconductor device during manufacture. In FIGS. 11 to 14, element structures in a semiconductor substrate 110 are not depicted. FIG. 14 schematically depicts a state of a tungsten film 106 filmed by a scanning electron microscope (SEM) after process at step S110 in FIG. 10 and before a process at step S111. FIGS. 11 to 14 are states during the processes at steps S105, S107, S108, S110 in FIG. 10, respectively.

Figure 11:
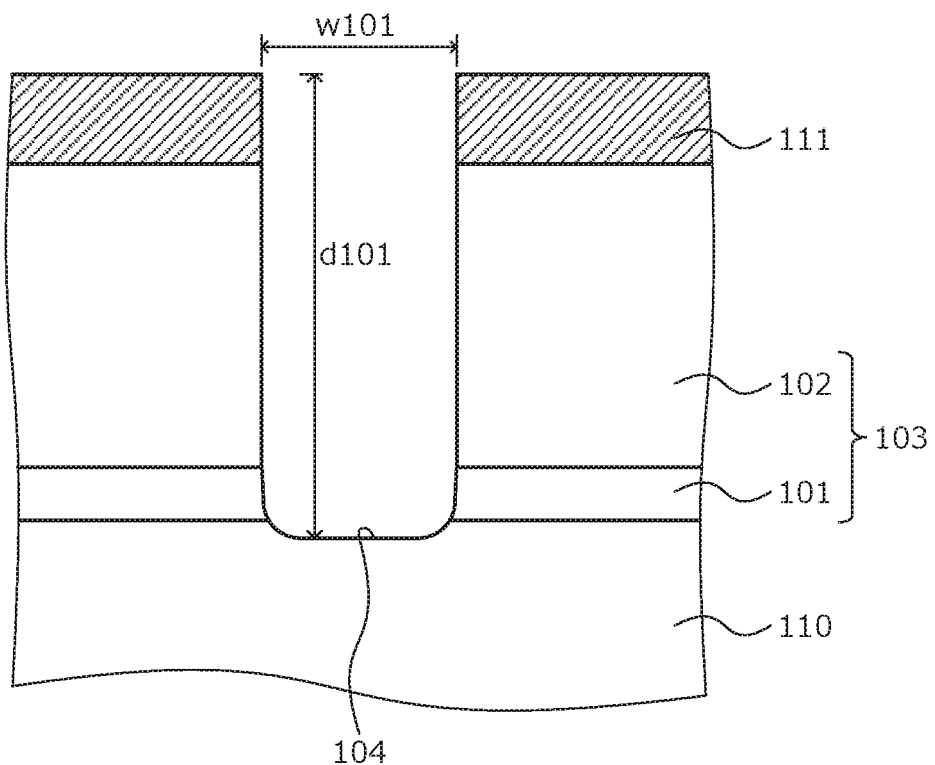
FIG. 11 is a cross-sectional view of the conventional semiconductor device during manufacture.

As described above, in the process at step S105, a width w101 of a contact hole 104 is uniform in the depth direction (FIG. 11). In the process at step S108, a barrier metal 105 grows partially thicker at upper ends (borders between side walls of the contact hole 104 and a front surface of the semiconductor substrate 110) 104a of the contact hole 104. Therefore, a width w111 between mutually facing portions of the barrier metal 105 on the upper ends 104a of the contact hole 104 is narrower than a width w112 between mutually facing portions of the barrier metal 105 at a portion 104c other than the upper ends 104a of the contact hole 104 (FIG. 13). In the process at step S110, the tungsten film 106 grows on the barrier metal 105 at an inner wall of the contact hole 104 and mutually facing portions of a surface of the tungsten film 106 on the mutually facing side walls of the contact hole 104 are in contact with each other, thereby filling a gap between mutually facing portions of the tungsten film 106 on the side walls, whereby the contact hole 104 is filled with the tungsten film 106.

However, as described above, when the width w111 between the mutually facing portions of the barrier metal 105 on the upper ends 104a of the contact hole 104 becomes narrow, portions of the tungsten film 106 on the mutually facing upper ends 104a of the contact hole 104 beyond the portions of the surface of the tungsten film 106 at the mutually facing side walls of the contact hole 104, contact each other, thereby closing the contact hole 104. When the contact hole 104 is closed in this manner, a cavity (void) 120 occurs in the tungsten film 106 (FIG. 14). Fluorine-based gas that is introduced into a reactor (chamber) when the tungsten film 106 is formed is enclosed in the cavity 120. Further, the cavity 120 occurs at a position that is deep enough from the surface of the tungsten film 106 that the cavity 120 does not appear at the surface of the tungsten film 106 after etchback of the tungsten film 106 at step S111 thereafter. Therefore, the cavity 120 remains in the tungsten film 106 in a state with the fluorine-based gas enclosed therein, even after the etchback at step S111.

The fluorine-based gas enclosed in the cavity 120 occurring in the tungsten film 106 adversely affects reliability of the semiconductor device (product). In particular, problems arise such as a front electrode (electrode, etc. containing aluminum (Al) as a main constituent: not depicted) on the tungsten film 106 being corroded by the fluorine-based gas enclosed in the cavity 120, the cavity 120 becoming larger due to expansion of the enclosed fluorine-based gas, a cavity further occurring in the front electrode, etc. In FIG. 14, the cavity 120 is a portion in the tungsten film 106 having a denser color than that of the tungsten film 106.

Further, in the sputter preprocessing at step S107, the natural oxide film that becomes a resistance component when left in the semiconductor device is removed. However, of a HTO film 101 and a BPSG film 102 configuring an interlayer insulating film 103, at a portion 104b at the BPSG film 102, the side wall of the contact hole 104 is removed and recessed by the sputter preprocessing at step S107 (FIG. 12). As a result, a width w102 of the portion 104b of the contact hole 104 at the BPSG film 102 becomes wider than the width w101 when the contact hole 104 is formed. Therefore, the sputter preprocessing at step S107 is also a factor causing the occurrence of the cavity 120 in the tungsten film 106.

The problems above become more remarkable as an aspect ratio (=a depth d101 of the contact hole 104/the width w101 of the contact hole 104) of the contact hole 104 increases. For example, the contact hole 104 of a sample schematically depicted in FIG. 14 has a substantially trapezoidal cross-sectional shape in which a width w101' ($\approx$0.6 μm) between the upper ends 104a is set slightly wider than a width w103 ($\approx$0.5 μm) of a bottom thereof. In this case, the width w101 of the contact hole 104 is the width w101' between the upper ends 104a of the contact hole 104. An embedding property of the tungsten film 106 with respect to the contact hole 104 is determined by the width w101' between the upper ends 104a of the contact hole 104. In other words, the sample schematically depicted in FIG. 14 depicts an occurrence of the cavity 120 in the tungsten film 106 when the aspect ratio (=the depth d101 of the contact hole 104/the width w101' between the upper ends 104a of the contact hole 104) of the contact hole 104 is about 1.6 ($\approx$1 μm/0.6 μm).

Embodiments of a semiconductor device and a method of manufacturing a semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 1:
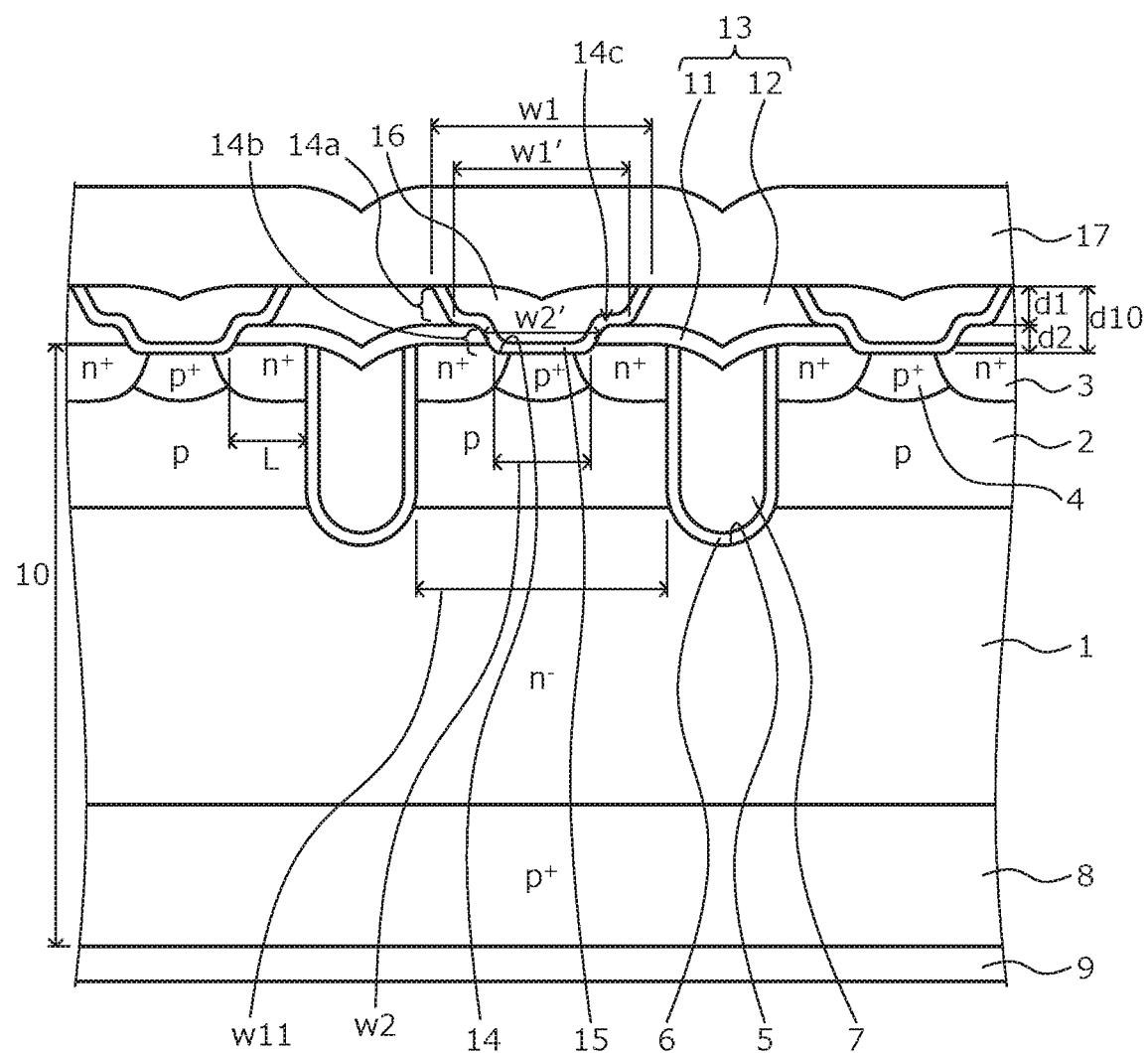
FIG. 1 is a cross-sectional view of a structure of the semiconductor device according to an embodiment.

A structure of a semiconductor device according to an embodiment will be described taking an insulated gate bipolar transistor (IGBT) as an example. FIG. 1 is a cross-sectional view of a structure of the semiconductor device according to the embodiment. In FIG. 1, two unit cells of an active region (region in which current flows when an element is in an ON state) that governs current driving are depicted, while other unit cells adjacent to these unit cells and an edge termination region surrounding a periphery of the active region are not depicted (similarly in FIGS. 3 to 9).

The edge termination region is a region between the active region and a side surface of a semiconductor substrate 10, and is a region of an n⁻-type drift region (second semiconductor region) 1 and is for mitigating electric field at a chip front surface side and sustaining breakdown voltage (withstand voltage). Breakdown voltage is a voltage limit at which no errant operation or destruction of an element occurs. In the edge termination region, for example, an edge termination structure such as a junction termination extension (JTE) structure, a field limiting ring (FLR), a field plate and a RESURF, or the like is disposed.

The semiconductor device according to the embodiment and depicted in FIG. 1 is a trench-gate IGBT that includes at a front surface side of the semiconductor substrate (semiconductor chip) 10, a MOS gate (insulated gate formed by a metal, an oxide film, and a semiconductor) of a trench-gate structure. The MOS gate is configured by a p-type base region (first semiconductor region) 2, an n⁺-type emitter region (fourth semiconductor region) 3, a p⁺-type contact region 4, a trench 5, a gate insulating film 6, and a gate electrode 7. One unit cell is configured by one trench 5 and contacts (electrical contact portions between the semiconductor substrate 10 and an emitter electrode 17) that are adjacent on both sides of the one trench 5. The p-type base region 2 is selectively provided in a surface layer at a front surface of the semiconductor substrate 10. A portion of the semiconductor substrate 10 other than the p-type base region 2 and a p⁺-type collector region (third semiconductor region) 8 described hereinafter is the n⁻-type drift region 1.

The n⁺-type emitter region 3 and the p⁺-type contact region 4 are selectively formed in a surface region (the surface layer at the front surface of the semiconductor substrate 10) of the p-type base region 2. The n⁺-type emitter region 3 and the p⁺-type contact region 4 are in contact with each other. The trench 5 penetrates the n⁺-type emitter region 3 and the p-type base region 2 and reaches the n⁻-type drift region 1. In the trench 5, the gate electrode 7 is provided via the gate insulating film 6. The p⁺-type collector region 8 is provided in a surface layer at a rear surface of the semiconductor substrate 10. A collector electrode (second electrode) 9 is provided at the rear surface of the semiconductor substrate 10 overall and is electrically connected to the p⁺-type collector region 8.

In the front surface of the semiconductor substrate 10, a high temperature oxide (HTO) film 11 and a BPSG film 12 are sequentially stacked as an interlayer insulating film 13 covering the gate electrode 7. The interlayer insulating film 13 is provided at the front surface of the semiconductor substrate 10 overall. A thickness of the HTO film 11 may be, for example, in a range from about 1000 Å to 2000 Å. A thickness of the BPSG film 12 may be, for example, in a range from about three times to four times the thickness of the HTO film 11. Instead of the HTO film 11, a thermal oxide film may be used as a lower layer of the interlayer insulating film 13. Instead of the BPSG film 12, a PSG film or a non-doped silicate glass (NSG) film may be used as an upper layer of the interlayer insulating film 13.

In the interlayer insulating film 13, a contact hole 14 that penetrates the interlayer insulating film 13 in the depth direction is provided. The depth direction is a direction from the front surface to the rear surface of the semiconductor substrate 10. A bottom of the contact hole 14 may protrude beyond the front surface of the semiconductor substrate 10, toward a collector side (toward the p⁺-type collector region 8). In other words, a through hole of the interlayer insulating film 13 and a groove formed at the front surface of the semiconductor substrate 10 and continuous with the through hole collectively may form the contact hole 14. The contact hole 14 may be disposed in a layout having a striped shape extending parallel to the front surface of the semiconductor substrate 10 or a layout having a matrix-like shape, when viewed from the front surface of the semiconductor substrate 10.

Further, the contact hole 14 has a cross-section shape in which a width w1 of a portion 14a at the BPSG film 12 is wider than a width w2 of a portion 14b at the HTO film 11. In other words, at a side wall of the contact hole 14, a single step 14c is provided at an interface between the HTO film 11 and the BPSG film 12, and a width of an upper end side of the contact hole 14 is wider than a width of a bottom side of the contact hole 14, in a step-like shape due to the step 14c. An upper end of the contact hole 14 is a border between a side wall of the contact hole 14 and the front surface of the semiconductor substrate 10.

An aspect ratio (=a depth d1 of the portion 14a of the contact hole 14 at the BPSG film 12/the width w1 of the portion 14a of the contact hole 14 at the BPSG film 12) of the portion 14a of the contact hole 14 at the BPSG film 12 may be, for example, in a range from about 0.5 to 1.5. A reason for this is as follows.

When the aspect ratio of the portion 14a of the contact hole 14 at the BPSG film 12 is less than 0.5 and the contact hole 14 is filled with a tungsten film 16, a recess occurs at an upper portion of the tungsten film 16. Therefore, the tungsten film 16 in the contact hole 14 may also disappear (be etched) by etchback for leaving the tungsten film 16 only in the contact hole 14.

Further, when the aspect ratio of the portion 14a of the contact hole 14 at the BPSG film 12 exceeds 1.5 and the contact hole 14 is filled with the tungsten film 16, portions of the tungsten film 16 deposited at the front surface of the semiconductor substrate 10 contact each other and become connected, whereby an upper portion of the portion 14a of the contact hole 14 at the BPSG film 12 becomes closed and a void may occur in the tungsten film 16.

An aspect ratio (=a depth d2 of the portion 14b of the contact hole 14 at the HTO film 11/the width w2 of the portion 14b of the contact hole 14 at the HTO film 11) of the portion 14b of the contact hole 14 at the HTO film 11 may be, for example, in a range from about 0.5 to 1.5. A reason for this is as follows.

When the aspect ratio of the portion 14b of the contact hole 14 at the HTO film 11 is less than 0.5 and the portion 14b of the contact hole 14 at the HTO film 11 is filled with the tungsten film 16, a recess occurs at the upper portion of the tungsten film 16. The recess at the upper portion of the tungsten film 16 has a large aspect ratio and is difficult to fill with the tungsten film 16. Therefore, when the portion 14*a* of the contact hole 14 at the BPSG film 12 is filled with the tungsten film 16, the recess at the upper portion of the tungsten film 16 at the portion 14*b* of the contact hole 14 at the HTO film 11 is not filled with the tungsten film 16 and may remain in the tungsten film 16 as a void.

Further, when the aspect ratio of the portion 14*b* of the contact hole 14 at the HTO film 11 exceeds 1.5 and the portion 14*b* of the contact hole 14 at the HTO film 11 is filled with the tungsten film 16, the tungsten film 16 is easily deposited at a tread (surface substantially parallel to the front surface of the semiconductor substrate 10) of the step 14*c* at the side walls of the contact hole 14. Portions of the tungsten film 16 deposited at the treads of the steps 14*c* at the side walls of the contact hole 14 contact each other and become connected, whereby an upper portion of the portion 14*b* of the contact hole 14 at the HTO film 11 becomes closed and a void may occur in the tungsten film 16.

An aspect ratio (=a depth d10 of the contact hole 14/the width w1 of the portion 14*a* of the contact hole 14 at the BPSG film 12) of the contact hole 14 overall may be, for example, in a range from about 0.5 to 1.5. A reason for this is a same as the reason that the aspect ratio of the portion 14*a* of the contact hole 14 at the BPSG film 12 may be set in the range described above.

The width w1 of the portion 14*a* of the contact hole 14 at the BPSG film 12 is, for example, 0.5 µm or more and may be as wide as possible without resulting in connection with the adjacent contact hole 14. As a result, an embedding property of the later described tungsten film 16 with respect to the contact hole 14 may be enhanced.

The width w2 of the portion 14*b* of the contact hole 14 at the HTO film 11 may be as narrow as possible. A reason for this is as follows. The trench 5 and the contact hole 14 are separated by a predetermined distance L, whereby an occurrence of leak current may be suppressed. Therefore, the predetermined distance L between the trench 5 and the contact hole 14 may be secured and a distance w11 between (mesa portion) the trenches 5 is reduced, enabling further size reductions of the unit cell.

In particular, the width (width of the bottom of the contact hole 14) w2 of the portion 14*b* of the contact hole 14 at the HTO film 11 is, for example, in a range from about 0.3 µm to 1.0 µm. A reason for this is as follows. When the width w2 of the portion 14*b* of the contact hole 14 at the HTO film 11 is less than 0.3 µm, embedding of the tungsten film (second metal film) 16 in the portion 14*b* of the contact hole 14 at the HTO film 11, via a barrier metal (first metal film) 15 described hereinafter, becomes difficult. When the width w2 of the portion 14*b* of the contact hole 14 at the HTO film 11 exceeds 1.0 µm, the emitter electrode (electrode containing aluminum as a main constituent: first electrode) 17 described hereinafter may be embedded in the portion 14*b* of the contact hole 14 at the HTO film 11, whereby a contact plug formed by the tungsten film 16 is unnecessary.

A cross-sectional shape of the portion 14*a* of the contact hole 14 at the BPSG film 12 may be a rectangular shape in which the side walls of the contact hole 14 are substantially orthogonal to the front surface of the semiconductor substrate 10. In other words, the width w1 of the portion 14*a* of the contact hole 14 at the BPSG film 12 may be uniform in the depth direction. In this case, size reductions of the unit cell are possible.

Further, a cross-sectional shape of the portion 14*a* of the contact hole 14 at the BPSG film 12 may be a trapezoidal shape in which a width toward the emitter electrode 17 is wider than a width w1' toward the HTO film 11. In this case, in the cross-sectional shape of the portion 14*a* of the contact hole 14 at the BPSG film 12, the width toward the emitter electrode 17 corresponds to the width w1 of the portion 14*a* of the contact hole 14 at the BPSG film 12 when the cross-sectional shape of the portion 14*a* of the contact hole 14 at the BPSG film 12 is a rectangular shape.

When the cross-sectional shape of the portion 14*a* of the contact hole 14 at the BPSG film 12 is a trapezoidal shape as described above, the width w1 of the emitter electrode 17 side of the portion 14*a* of the contact hole 14 at the BPSG film 12 is relatively wide, thereby enabling the embedding property of the tungsten film 16 into the contact hole 14 to be enhanced. Additionally, the width w2 of the portion 14*b* of the contact hole 14 at the HTO film 11 is narrower, enabling the distance w11 between the trenches 5 to be reduced.

A cross-sectional shape of the portion 14*b* of the contact hole 14 at the HTO film 11 may be a rectangular shape in which the side walls of the contact hole 14 are substantially orthogonal to the front surface of the semiconductor substrate 10. In other words, the width w2 of the portion 14*b* of the contact hole 14 at the HTO film 11 may be uniform in the depth direction. In this case, size reductions of the unit cell are possible.

The cross-sectional shape of the portion 14*b* of the contact hole 14 at the HTO film 11 may be a trapezoidal shape in which a width w2' toward the BPSG film 12 is wider than a width (the width of the bottom of the contact hole 14) toward the semiconductor substrate 10. The width w2' of the BPSG film 12 side of the portion 14*b* of the contact hole 14 at the HTO film 11 is narrower than the width w1' of the HTO film 11 side of the portion 14*a* of the contact hole 14 at the BPSG film 12 by a width of the tread (the surface substantially parallel to the front surface of the semiconductor substrate 10) of the step 14*c*. A width of the semiconductor substrate 10 side of the portion 14*b* of the contact hole 14 at the HTO film 11 corresponds to the width w2 of the portion 14*b* of the contact hole 14 at the HTO film 11 when the cross-sectional shape of the portion 14*b* of the contact hole 14 at the HTO film 11 is a rectangular shape.

When the cross-sectional shape of the portion 14*b* of the contact hole 14 at the HTO film 11 is a trapezoidal shape as described above, the width w2' of an upper end side of the portion 14*b* of the contact hole 14 at the HTO film 11 widened, enabling the embedding property of the tungsten film 16 with respect to the portion 14*b* of the contact hole 14 at the HTO film 11 to be enhanced. Additionally, the width of the bottom of the contact hole 14 is reduced, thereby enabling the distance w11 between the trenches 5 to be reduced.

In the contact hole 14, the barrier metal 15 is provided along an inner wall (side surfaces of the interlayer insulating film 13 and the front surface of the semiconductor substrate 10) of the contact hole 14. The barrier metal 15 may extend to a surface (i.e., surface of the BPSG film 12) of the interlayer insulating film 13. The barrier metal 15 has high adhesion with a semiconductor portion (the semiconductor substrate 10) and is formed by a metal forming an ohmic contact with the semiconductor portion. In particular, the barrier metal 15 may be, for example, a titanium (Ti) film, or a stacked metal film in which a titanium film and a titanium nitride (TiN) film are stacked. A thickness of the barrier metal 15 may be, for example, in a range from about 0.1 μm to 0.2 μm and particularly, may be, for example, 0.15 μm.

On the barrier metal 15, the tungsten (W) film 16 is provided as a contact plug so as to be embedded in the contact hole 14. The emitter electrode 17 is provided at the front surface of the semiconductor substrate 10 overall in the active region. The emitter electrode 17 is electrically connected to the $n^+$-type emitter region 3 and the $p^+$-type contact region 4, via the tungsten film 16 and the barrier metal 15, and is electrically connected to the p-type base region 2, via the $p^+$-type contact region 4.

An electrode structure is formed in which the emitter electrode 17 and a semiconductor portion are electrically connected via the barrier metal 15 and the tungsten film 16 embedded in the contact hole 14 in this manner, whereby trench pitch (the distance w11 between the trenches 5) may be narrowed. Further, the emitter electrode 17 is electrically insulated from the gate electrode 7 by the interlayer insulating film 13. The emitter electrode 17 is, for example, an aluminum-silicon (Al—Si) electrode containing aluminum as a main constituent.

Figure 2:
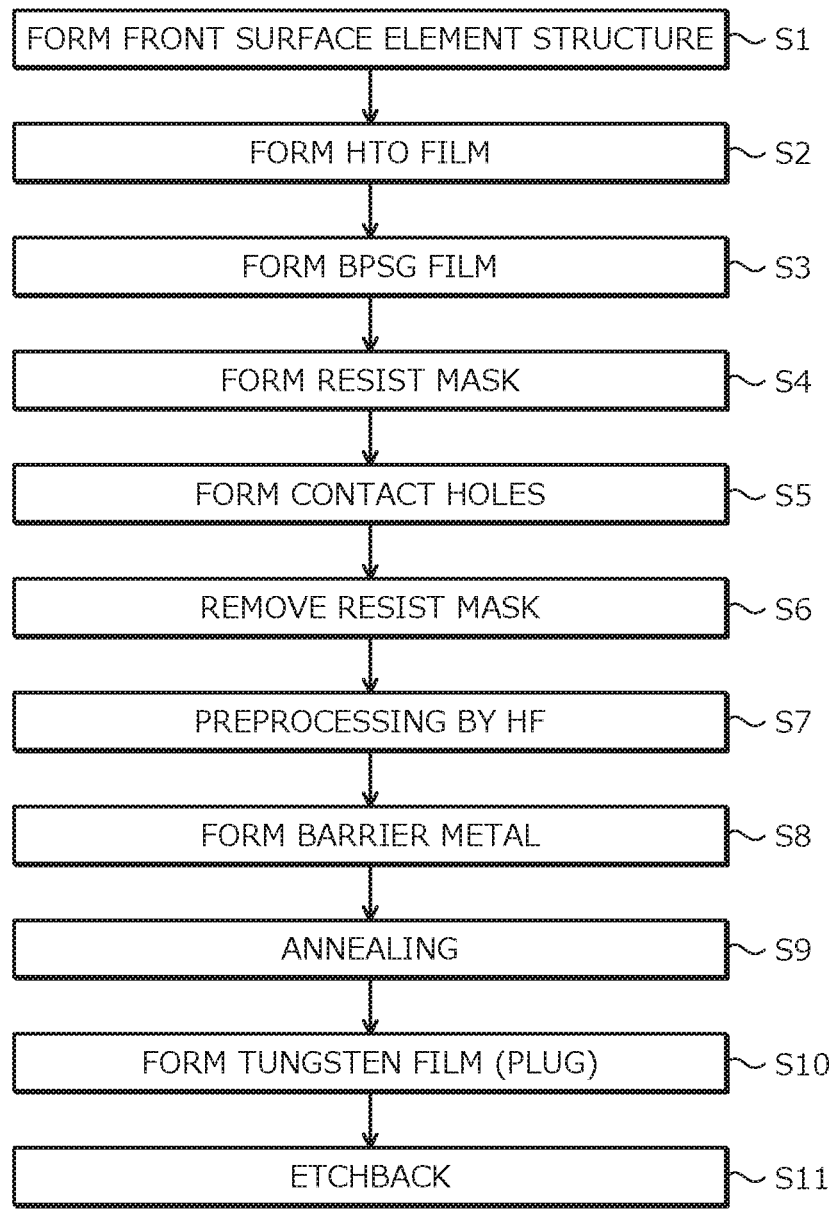
FIG. 2 is a flowchart of an outline of a method of manufacturing the semiconductor device according to the embodiment.
Figure 6:
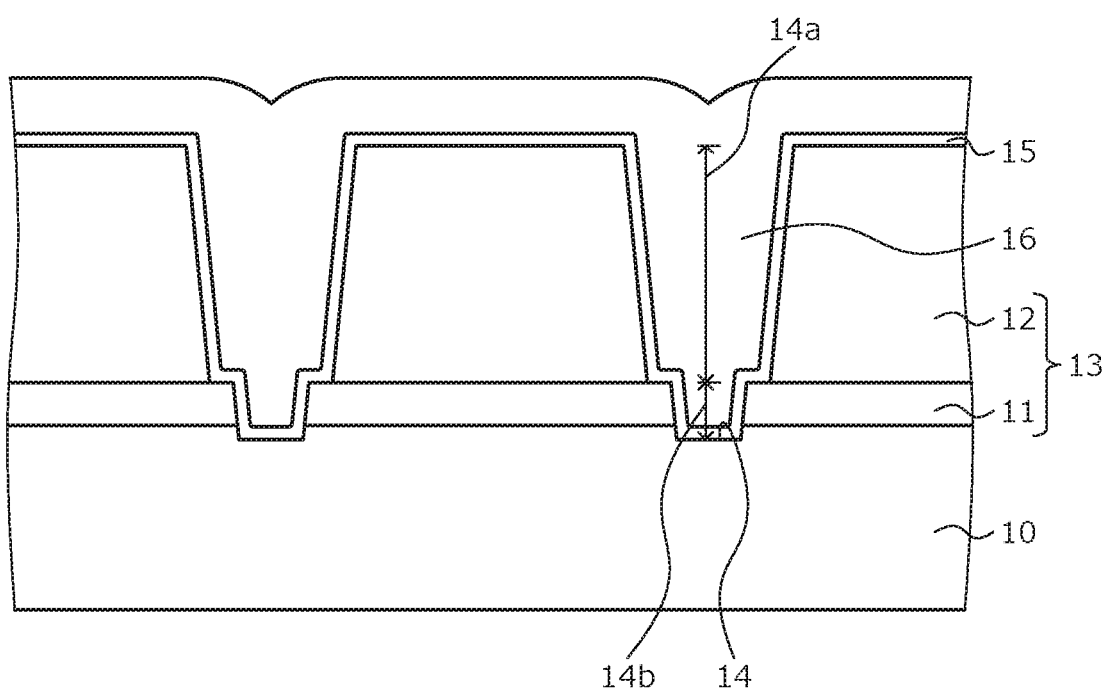
FIG. 6 is a cross-sectional view of the semiconductor device according to the embodiment during manufacture.
Figure 7:
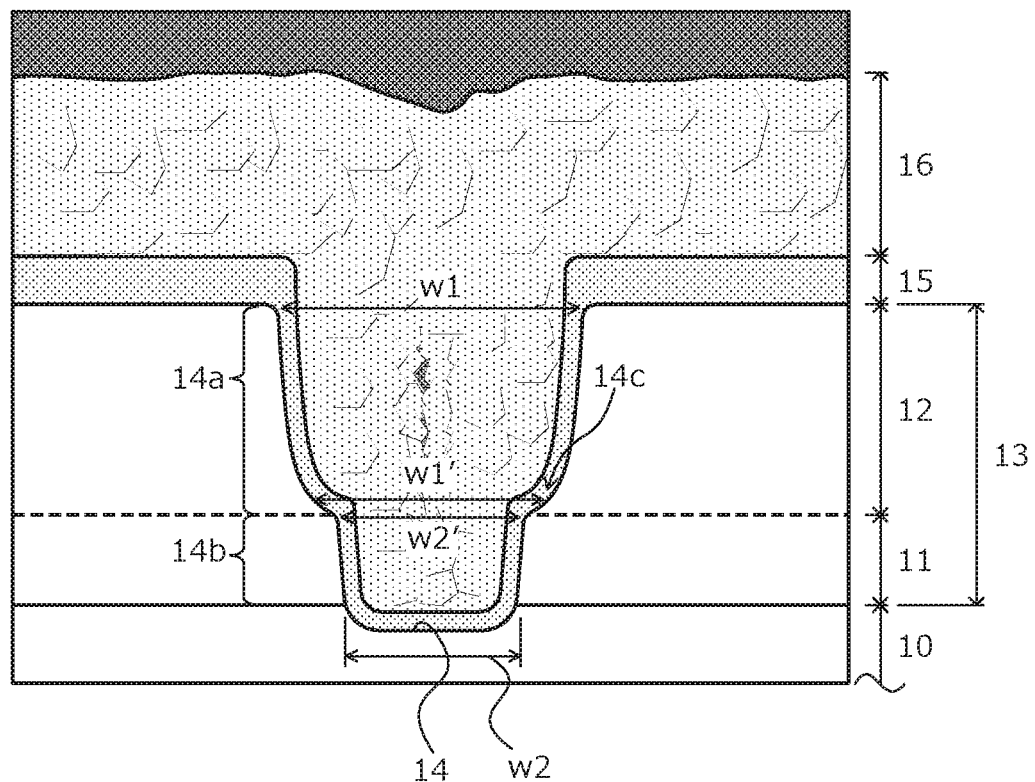
FIG. 7 is a cross-sectional view of the semiconductor device according to the embodiment during manufacture.

Next, a method of manufacturing the semiconductor device according to the embodiment will be described. FIG. 2 is a flowchart of an outline of the method of manufacturing the semiconductor device according to the embodiment. FIGS. 3, 4, 5, 6, 7, and 8 are cross-sectional views of the semiconductor device according to the embodiment during manufacture. FIG. 9 is a cross-sectional view of another example of a state of the semiconductor device according to the embodiment during manufacture. In FIGS. 3 to 9, element structures in the semiconductor substrate 10 are not depicted. FIG. 7 schematically depicts a state of the tungsten film 16 filmed by a scanning electron microscope (SEM) after a process at step S10 and before a process at step S11 in FIG. 2. FIGS. 3 to 6 correspond to steps S5, S7, S8, and S10 in FIG. 2, respectively.

Figure 3:
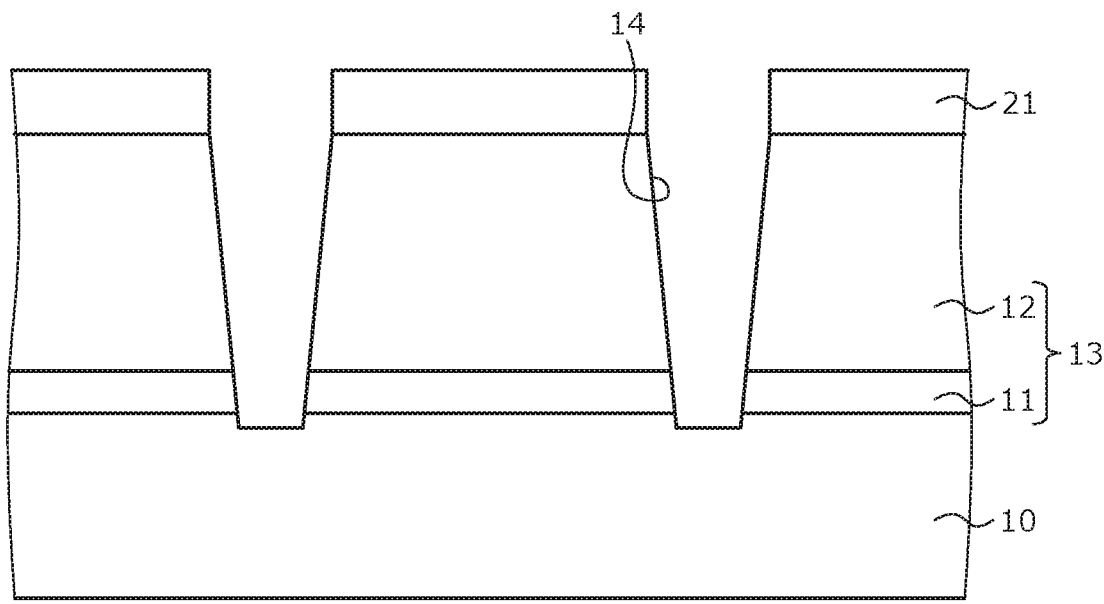
FIG. 3 is a cross-sectional view of the semiconductor device according to the embodiment during manufacture.

First, at the front surface side of the semiconductor substrate (semiconductor wafer) 10, a predetermined element structure (MOS gate, i.e., the p-type base region 2, the $n^+$-type emitter region 3, the $p^+$-type contact region 4, the trench 5, the gate insulating film 6, and the gate electrode 7) of the trench-gate IGBT is formed (step S1). Next, as depicted in FIG. 3, on the front surface of the semiconductor substrate 10, the HTO film 11 is formed by, for example, a CVD method as a first layer of the interlayer insulating film 13 (step S2). Next, on the front surface of the semiconductor substrate 10, the BPSG film 12 is formed by, for example, a CVD method as a second layer of the interlayer insulating film (step S3). Next, on the interlayer insulating film 13, a resist mask 21 in which formation regions of the contact hole 14 are opened is formed as an etching mask that is used at a subsequent etching process (step S4).

Next, the interlayer insulating film 13 is selectively removed by dry etching using the resist mask 21 as a mask, thereby forming the contact holes 14 (step S5). Portions of the front surface of the semiconductor substrate 10 exposed in the contact holes 14 may be slightly removed by the dry etching at step S5. Further, in a process at step S5, a natural oxide film (not depicted) is formed at a silicon (Si) face (contact formation position between the barrier metal 15 and the semiconductor substrate 10) exposed in the contact holes 14.

Further, in the process at step S5, when the contact holes 14 are formed by anisotropic etching, the contact holes 14 have a cross-sectional shape that is a rectangular shape in which the side walls are substantially orthogonal to the front surface of the semiconductor substrate 10. In other words, the portion 14a of the contact hole 14 at the BPSG film 12 and the portion 14b in the HTO film 11 both have a cross-sectional shape that is a substantially rectangular shape.

Further, in the process at step S5, when the contact holes 14 are formed by isotropic etching, the contact holes 14 have a cross-sectional shape that is a trapezoidal shape in which the width of the upper end side is slightly wider than the width on the bottom side. In other words, the portion 14a of the contact hole 14 at the BPSG film 12 and the portion 14b in the HTO film 11 both have a cross-sectional shape that is a substantially trapezoidal shape.

Figure 4:
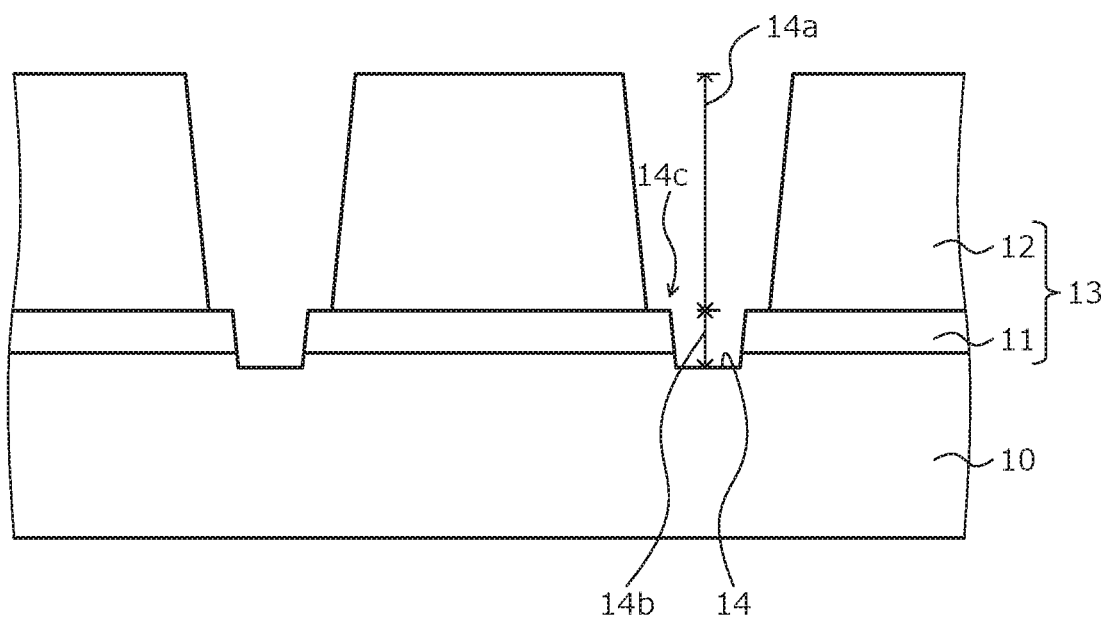
FIG. 4 is a cross-sectional view of the semiconductor device according to the embodiment during manufacture.

Next, as depicted in FIG. 4, the resist mask is removed (step S6). Next, as preprocessing of a subsequent barrier metal formation process, the natural oxide film formed during the process at step S5 is removed by wet etching by an aqueous solution of hydrofluoric acid (HF) or an aqueous solution of a dilute hydrofluoric acid (step S7). In a process at step S7, an etching rate of the interlayer insulating film 13 by the aqueous solution of hydrofluoric acid or the aqueous solution of a dilute hydrofluoric acid is quicker at the portion 14a in the BPSG film 12 than that at the portion 14b in the HTO film 11.

Therefore, at step S7, as a consequence of differences in the etching rate for the BPSG film 12 and the HTO film 11, the width w1 of the portion 14a of the contact hole 14 at the BPSG film 12 becomes wider than the width w2 of the portion 14b of the contact hole 14 at the HTO film 11 in a step-like shape, thereby forming the single step 14c at the side walls of the contact hole 14. On the other hand, the HTO film 11 is not substantially etched. Therefore, the width w2 of the portion 14b of the contact hole 14 at the HTO film 11 is maintained at a width (i.e., design value) at the time of the process at step S5 and desired characteristics are obtained.

The width w1 of the portion 14a of the contact hole 14 at the BPSG film 12 may be variously changed by time control of the wet etching. Further, in the process at step S7, the silicon face exposed in the contact holes 14 is not etched and therefore, the depth d10 of the contact hole 14 is maintained at a same depth as before the preprocessing. In this manner, in the process at step S7, the natural oxide film formed during the process at step S5 is removed and the width w1 of the portion 14a of the contact hole 14 at the BPSG film 12 is widened, enabling the aspect ratio of the contact hole 14 overall to be reduced.

Further, in a case where the preprocessing is assumed to be by dry etching, dry etching rates of the HTO film 11 and the BPSG film 12 are the same and therefore, the widths w1, w2 of the portion 14a of the contact hole 14 at the BPSG film 12 and of the portion 14b in the HTO film 11 become wider uniformly. Therefore, in the present invention, the process at step S7 is performed by wet etching. Further, even when the first layer of the interlayer insulating film 13 is a thermal oxide film instead of the HTO film 11 or when the second layer of the interlayer insulating film 13 is a PSG film or a NSG film instead of the BPSG film 12, a width of a portion of the PSG film or the NSG film in the contact hole 14 may be made relatively wide by the preprocessing by a hydrofluoric acid solution or a dilute hydrofluoric acid solution.

Figure 5:
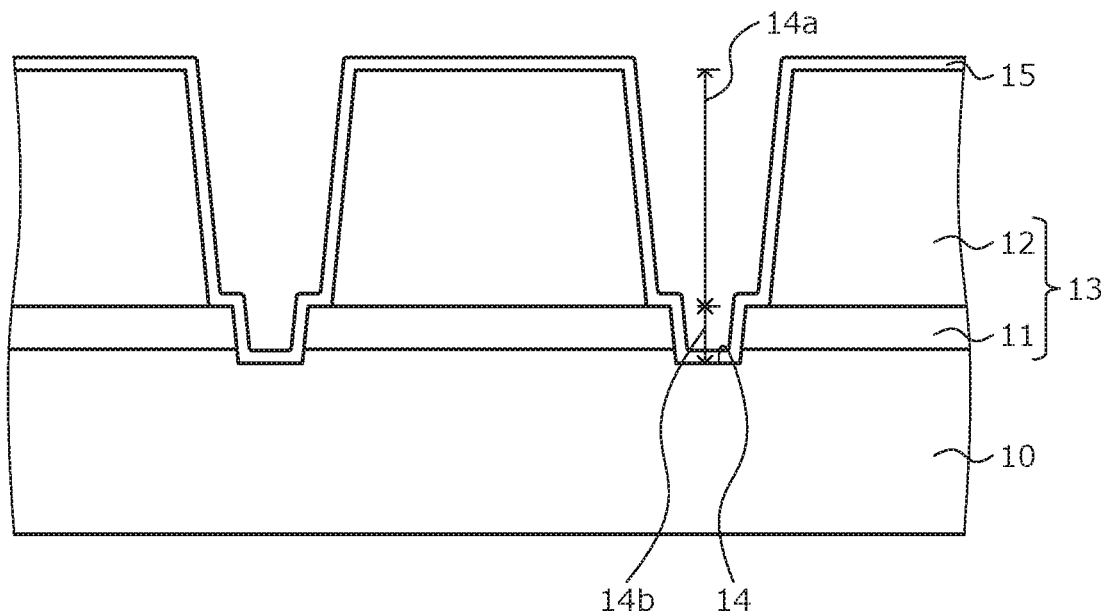
FIG. 5 is a cross-sectional view of the semiconductor device according to the embodiment during manufacture.

Next, as depicted in FIG. 5, a titanium film and a titanium nitride film are sequentially formed along the inner walls of the contact holes 14 as the barrier metal 15 (step S8). The titanium film and the titanium nitride film may be formed by sputtering or chemical vapor deposition (CVD). As described above, the width w1 of the portion 14a of the contact hole 14 at the BPSG film 12 is made wide during the process at step S7, whereby at a process at step S8, the barrier metal 15 may be formed having a uniform thickness and the barrier metal 15 does not grow thick at portions.

The process at step S8 may be performed within, for example, 24 hours after the process at step S7. A reason for this is that when the semiconductor substrate 10 is left (stored) for more than 24 hours after the process at step S7, a natural oxide film thick enough to adversely affect semiconductor device characteristics of is again formed at the silicon face exposed in the contact holes 14. Before the process at step S8, when the semiconductor substrate 10 is temporarily stored after the process at step S7, a storage site of the semiconductor substrate 10 suffices to be other than an environment positively sprayed with oxygen and may be an environment exposed to the atmosphere.

Next, by annealing (heat treatment), an ohmic contact between the barrier metal 15 and the semiconductor substrate 10 is formed (step S9). Next, as depicted in FIG. 6, using a CVD method, by a reduction reaction of tungsten hexafluoride ($WF_6$) and hydrogen ($H_2$), the tungsten film 16 is grown on the barrier metal 15, and the tungsten film 16 is embedded in the contact holes 14 (step S10). In a process at step S10, the tungsten film 16 is grown on the inner wall (side walls and bottom) of each contact hole 14 and portions of a surface of the tungsten film 16 on the mutually facing side walls of the contact hole 14 contact each other, thereby filling a gap between portions of the tungsten film 16 on the side walls, whereby the contact hole 14 is filled with the tungsten film 16.

As described above, the width w1 of the portion 14a of the contact hole 14 at the BPSG film 12 is widened during the process at step S7, whereby the aspect ratio of the contact hole 14 is reduced. Therefore, in the process at step S10, before the portions of the tungsten film 16 grown on the inner wall of the contact hole 14 contact each other at the mutually facing upper ends of the contact hole 14 and close the contact hole 14, the portions of the surface of the tungsten film 16 on the mutually facing side walls of the contact hole 14 may contact each other. Therefore, no cavity occurs in the tungsten film 16 and the contact hole 14 may be almost completely embedded with the tungsten film 16 (refer to FIG. 7).

Next, the tungsten film 16 is etched back, thereby leaving the tungsten film 16 only on the barrier metal 15 in the contact hole 14 (step S11). For example, in the process at step S10, assuming a cavity occurs in the tungsten film 16, the cavity occurs at a position shallow enough from the surface of the tungsten film 16 to appear by that the cavity being opened at an upper portion by the etchback at step S11 to become a groove 20 (refer to FIG. 9) at the surface of the tungsten film 16 after the etchback. Therefore, even when a cavity occurs in the tungsten film 16 during the process at step S10, fluorine-based gas enclosed in the cavity by the process at step S11 is released outside.

Figure 8:
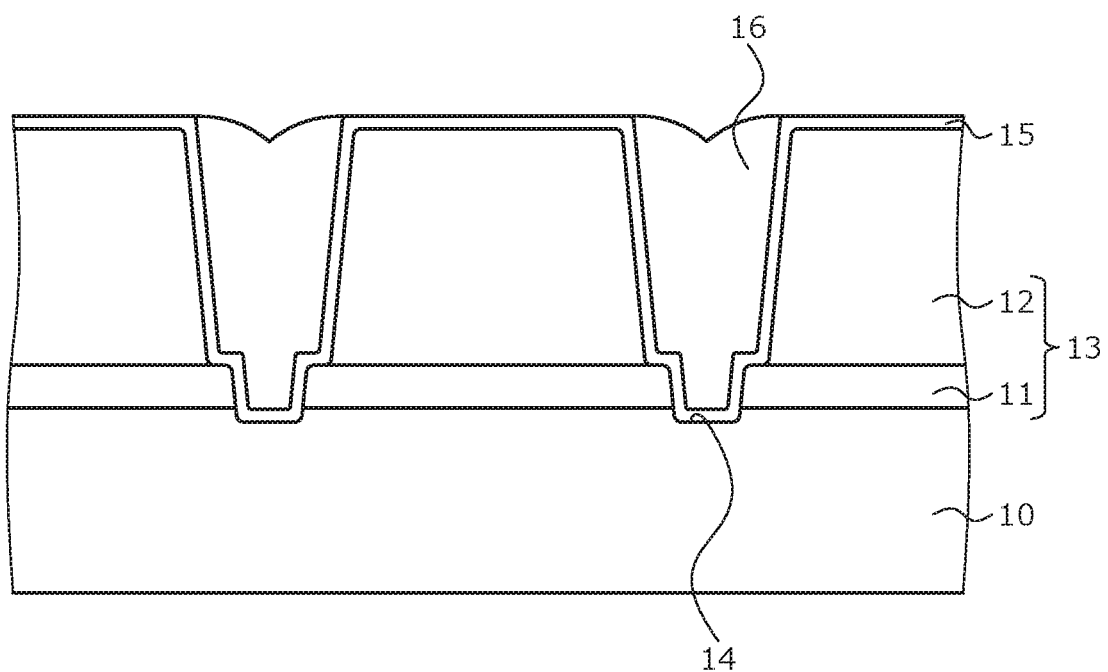
FIG. 8 is a cross-sectional view of the semiconductor device according to the embodiment during manufacture.
Figure 9:
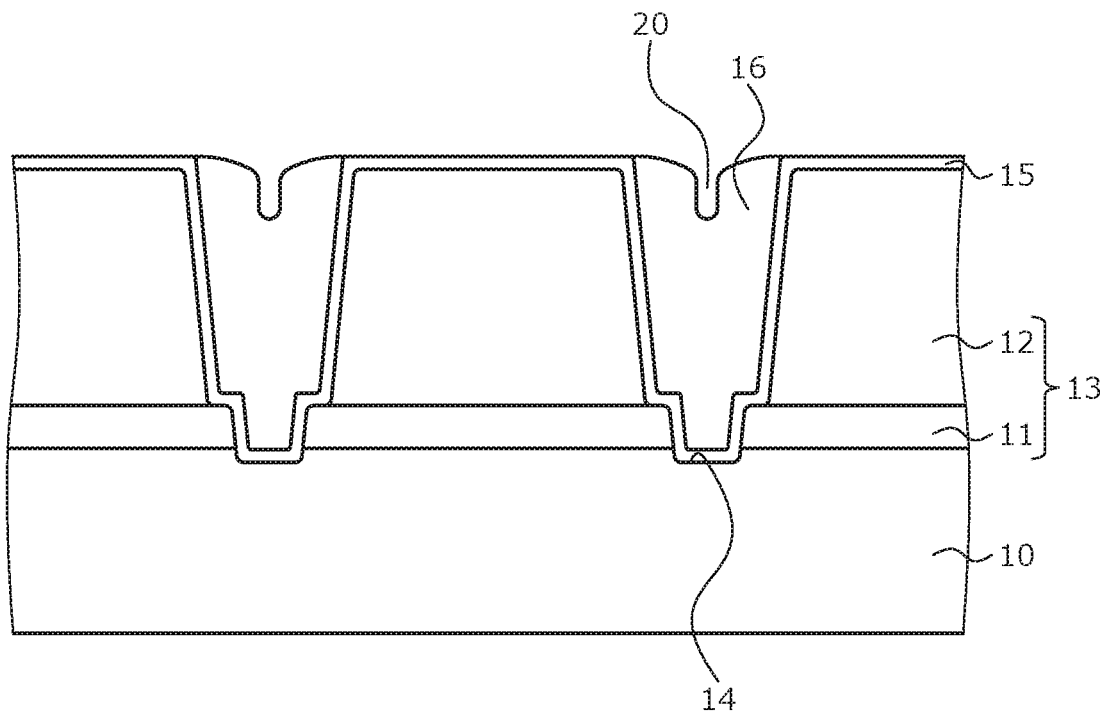
FIG. 9 is a cross-sectional view of another example of a state of the semiconductor device according to the embodiment during manufacture.

In FIG. 8, while a case in which no cavity occurs in the tungsten film 16 is depicted, in FIG. 9, a cavity occurring in the tungsten film 16 during the process at step S10 is depicted in a state in which after the etchback at step S11, the cavity becomes the groove 20 and appears at the surface of the tungsten film 16. In the groove 20 generated at the surface of the tungsten film 16, the emitter electrode 17 is embedded subsequently. Next, remaining parts such as the emitter electrode 17, the $p^+$-type collector region 8, the collector electrode 9, etc. are formed. Next, the semiconductor wafer is diced (cut) into individual chips, whereby the semiconductor device depicted in FIG. 1 is completed.

As described above, according to one embodiment, the interlayer insulating film is provided in which a first insulating film (HTO film) and a second insulating film (BPSG film) having as compared to the first insulating film, a quicker etching rate by an aqueous solution containing hydrofluoric acid or dilute hydrofluoric acid used in wet etching of preprocessing for forming a barrier metal are sequentially stacked. As a result, by the preprocessing performed after the contact holes are formed in the interlayer insulating film, a width of a portion of the contact hole in the second insulating film is made wider than a width of a portion in the first insulating film, in a step-like shape, and the aspect ratio of the contact hole may be reduced. As a result, even when a contact hole of a micro-pattern is formed and for unit cell size reductions, the barrier metal may be formed having a uniform thickness, along the inner wall of the contact hole. Additionally, in the contact hole, the tungsten film that forms a contact plug may be embedded on the barrier metal without a cavity occurring in the tungsten film. Therefore, the contact hole of the micro-pattern may be formed, enabling unit cell size reductions. Additionally, fluorine-based gas that adversely affects element characteristics may be prevented from being included in the tungsten film that is the contact plug electrically connecting the front electrode and the semiconductor substrate and therefore, reliability of the semiconductor device (product) may be enhanced.

In the foregoing, the present invention is not limited to the embodiments described above and various modifications within a range not departing from the spirit of the invention are possible. For example, the invention is applicable to various types of elements in which a contact between the front electrode and the semiconductor substrate is formed via a contact plug. In particular, the invention is further applicable to, for example, metal oxide semiconductor field effect transistors (MOSFETs: MOS-type field effect transistors including an insulated gate formed by a 3-layer structure of a metal, an oxide film, and a semiconductor) and reverse conducting IGBTs (RC-IGBTs). The invention is further applicable to a planar-gate structure instead of a trench-gate structure. Furthermore, the invention is similarly implemented when conductivity types (n-type, p-type) are reversed.

According to the present invention, by the wet etching of the preprocessing for forming the first metal film, the width of a portion of the contact hole in the second insulating film is made wider than the width of a portion in the first insulating film, in a step-like shape, thereby enabling the aspect ratio of the contact hole to be reduced. As a result, even when a contact hole of a micro-pattern is formed for unit cell size reductions, the first metal film may be formed having a uniform thickness, along the inner wall of the contact hole. Additionally, the second metal film that forms the contact plug may be embedded in the contact hole, on the first metal film without a cavity occurring in the second metal film.

The semiconductor device and the method of manufacturing a semiconductor device according to the present invention achieve an effect in that size reductions may be facilitated and reliability may be enhanced.

As described, the semiconductor device and the method of manufacturing a semiconductor device according to the present invention are useful for semiconductor devices in which a contact between the front electrode and the semiconductor substrate is formed by a contact plug and are particularly suitable for trench-gate IGBTs.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A semiconductor device, comprising:
a semiconductor substrate having a first main surface and a second main surface opposite to the first main surface, the semiconductor substrate including:
  a first semiconductor region of a second conductivity type provided closer to the first main surface than the second main surface of the semiconductor substrate,
  a second semiconductor region of a first conductivity type, provided at a side of the second main surface of the semiconductor substrate with respect to the first semiconductor region;
an element structure provided in the semiconductor substrate, the element structure having the first semiconductor region and the second semiconductor region, and a pn junction between the first semiconductor region and the second semiconductor region;
an interlayer insulating film provided on the first main surface of the semiconductor substrate and covering the element structure, the interlayer insulating film including:
  a first insulating film provided on the first main surface of the semiconductor substrate, and
  a second insulating film provided on the first insulating film and being made from an insulation material having an etching rate faster than an etching rate of an insulation material of the first insulating film with respect to hydrofluoric acid or dilute hydrofluoric acid,
a contact hole penetrating through the interlayer insulating film and reaching the first main surface of the semiconductor substrate, the contact hole including a lower portion disposed in the first insulating film and an upper portion disposed in the second insulating film, and having a side wall with a step between the upper portion and the lower portion, a width of the upper portion being greater than a width of the lower portion in a direction parallel to the first main surface of the semiconductor substrate, the upper portion having an aspect ratio in a range of 0.5 to 1.5, the lower portion having an aspect ratio in a range of 0.5 to 1.5;
a first metal film provided along an inner surface of the contact hole, the first metal film having high adhesion with the semiconductor substrate and forming an ohmic contact with the semiconductor substrate;
a second metal film embedded in the contact hole, on the first metal film; and
a first electrode provided on the interlayer insulating film and the second metal film, and electrically connected to the first semiconductor region via the second metal film and the first metal film, wherein
the lower portion has an upper side facing the upper portion and a lower side facing the first semiconductor region, and a width of the lower side of the lower portion of the contact hole is equal to or greater than 0.3 µm and less than 1.0 µm.

2. The semiconductor device according to claim 1, wherein the upper portion of the contact hole has a trapezoidal shape in a cross-sectional view in which a width of an upper side facing the first electrode is greater than a width of a lower side facing the lower portion of the contact hole.

3. The semiconductor device according to claim 1, wherein the lower portion of the contact hole has a trapezoidal shape in a cross-sectional view in which a width of an upper side facing the upper portion of the contact hole is greater than a width of a lower side facing the first semiconductor region.

4. The semiconductor device according to claim 1, wherein the second insulating film is a silicon glass film.

5. The semiconductor device according to claim 4, wherein the second insulating film contains phosphorus, or contains phosphorus and boron.

6. The semiconductor device according to claim 1, wherein the first insulating film is a high temperature oxide film or a thermal oxide film.

7. The semiconductor device according to claim 1, wherein the first metal film contains titanium as a main constituent.

8. The semiconductor device according to claim 1, wherein the second metal film contains tungsten as a main constituent.

9. The semiconductor device according to claim 1, further comprising:
a third semiconductor region in contact with the second semiconductor region, and being provided at the second main surface of the semiconductor substrate; and
a second electrode electrically connected to the third semiconductor region, wherein the element structure further comprises:
  a fourth semiconductor region of the first conductivity type, selectively provided on the first semiconductor region,
  a trench penetrating through the first semiconductor region and reaching the second semiconductor region,
  a gate insulating film provided in the trench in contact with the first semiconductor region at a portion between the second semiconductor region and the fourth semiconductor region, and
  a gate electrode provided in in the trench on the gate insulating film.

* * * * *